United States Patent [19]

Muraki et al.

[11] Patent Number: 4,974,919
[45] Date of Patent: Dec. 4, 1990

[54] ILLUMINATING DEVICE

[75] Inventors: Masato Muraki; Masato Aketagawa; Takahisa Shiozawa, all of Yokohama, Japan

[73] Assignee: Canon Kabushiki Kaisha, Tokyo, Japan

[21] Appl. No.: 384,908

[22] Filed: Jul. 25, 1989

Related U.S. Application Data

[63] Continuation of Ser. No. 113,201, Oct. 27, 1987, abandoned.

[30] Foreign Application Priority Data

| Oct. 30, 1986 | [JP] | Japan | 61-260237 |
| Oct. 30, 1986 | [JP] | Japan | 61-260238 |
| Feb. 5, 1987 | [JP] | Japan | 62-025262 |
| Oct. 22, 1987 | [JP] | Japan | 62-267890 |

[51] Int. Cl.$^5$ ............ G02B 26/08; G03B 21/00
[52] U.S. Cl. ............ 350/6.6; 350/6.4; 350/6.91; 350/169; 353/122; 362/268
[58] Field of Search ............ 350/167; 362/259, 268

[56] References Cited

U.S. PATENT DOCUMENTS

| 3,378,687 | 4/1968 | Schepler | 350/6.4 |
| 3,524,706 | 8/1970 | Farr | 350/169 |
| 3,892,468 | 7/1975 | Duguay | 350/169 |
| 4,101,193 | 7/1978 | Waterworth et al. | 350/6.8 |
| 4,118,109 | 10/1978 | Crawford et al. | 350/6.4 |
| 4,132,479 | 1/1979 | Dubroeuco et al. | 355/71 |
| 4,373,774 | 2/1983 | Dubroeuco et al. | 350/6.6 |
| 4,408,826 | 10/1983 | Ike | 350/6.8 |
| 4,493,555 | 1/1985 | Reynolds | 356/358 |
| 4,571,021 | 2/1986 | Minoura | 350/6.8 |
| 4,619,508 | 10/1986 | Shibuya et al. | 353/122 |
| 4,634,240 | 1/1987 | Suzuki | 350/508 |
| 4,851,978 | 7/1989 | Ichihara | 350/6.6 |

FOREIGN PATENT DOCUMENTS

| 0066053 | 12/1982 | European Pat. Off. |
| 1940361 | 4/1970 | Fed. Rep. of Germany |
| 2140549 | 1/1976 | Fed. Rep. of Germany |
| 50-123444 | 9/1975 | Japan |
| 54-111832 | 9/1979 | Japan |
| 58-215621 | 12/1983 | Japan |
| 58-222522 | 12/1983 | Japan |
| 518598 | 3/1972 | Switzerland |
| 1259588 | 1/1972 | United Kingdom |
| 1280681 | 7/1972 | United Kingdom |
| 1353739 | 5/1974 | United Kingdom |

OTHER PUBLICATIONS

Lacombat, et al., "Laser Projection Printing", (Aug. 1980), p. 115–121.

Primary Examiner—Bruce Y. Arnold
Assistant Examiner—Loha Ben
Attorney, Agent, or Firm—Fitzpatrick, Cella, Harper & Scinto

[57] ABSTRACT

An illumination device includes a light source for supplying light, an optical system for forming plural light fluxes from the light supplied by the light source, a scanning system disposed to receive the light fluxes formed by the forming optical system and for scanning the light fluxes substantially at the same time, and another optical system effective to superimpose the scanned light fluxes upon one another on a surface to be irradiated.

25 Claims, 11 Drawing Sheets

○ T0
△ T1
▲ T2
▽ T3
▼ T4

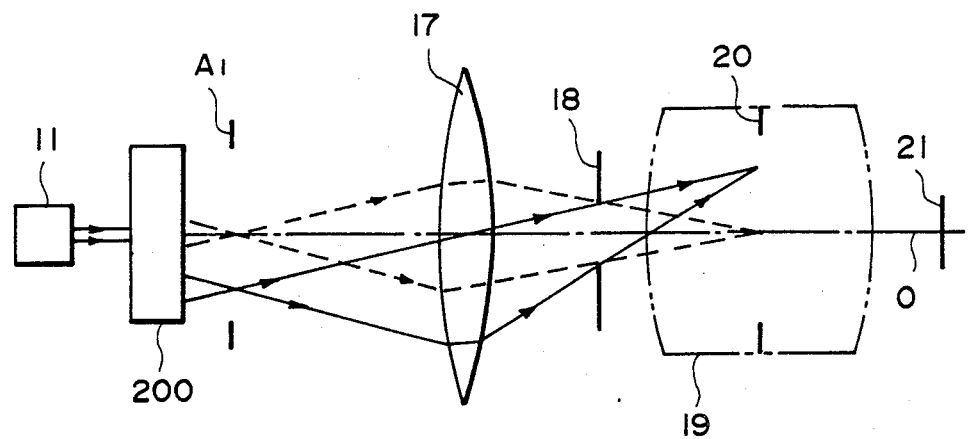
F I G. 7A
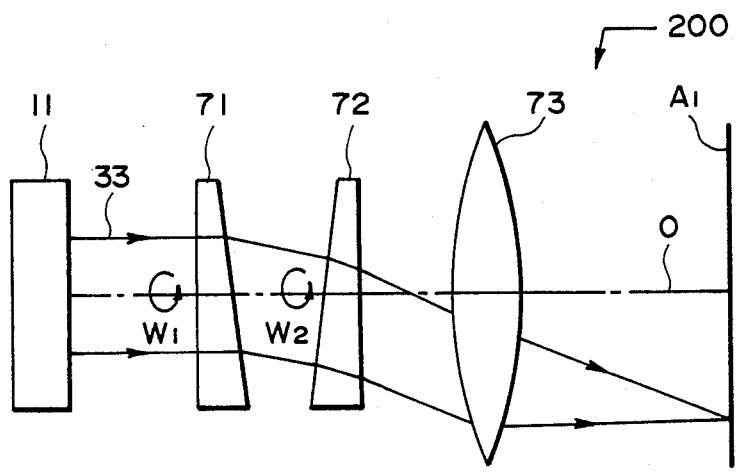
F I G. 7B

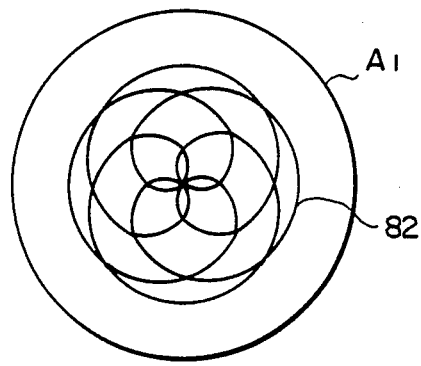
F I G. 8A
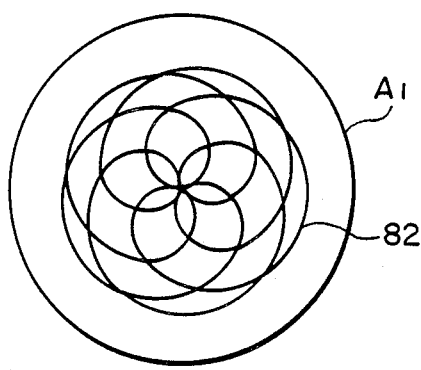
F I G. 8B
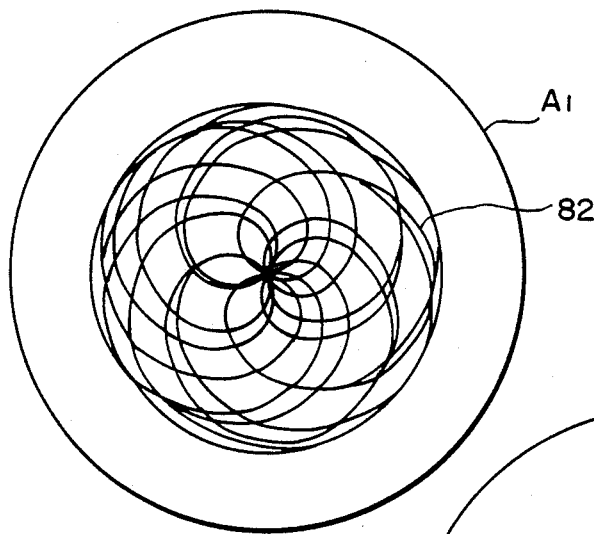
F I G. 8C
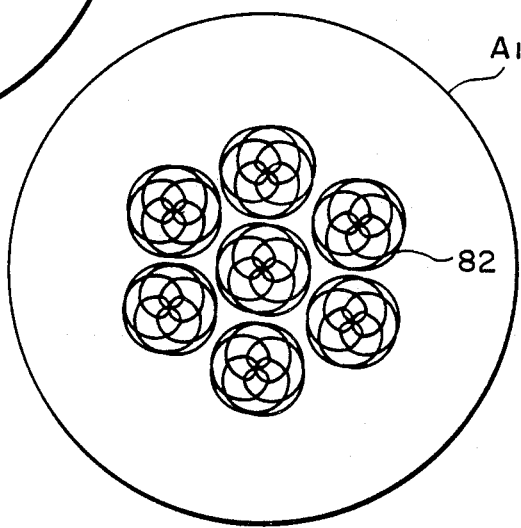
F I G. 8D

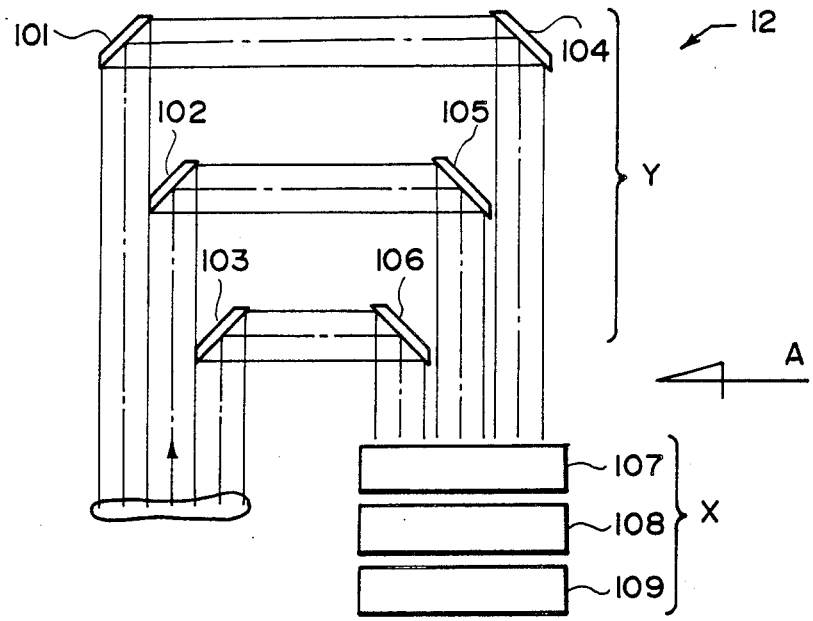
F I G. 10A
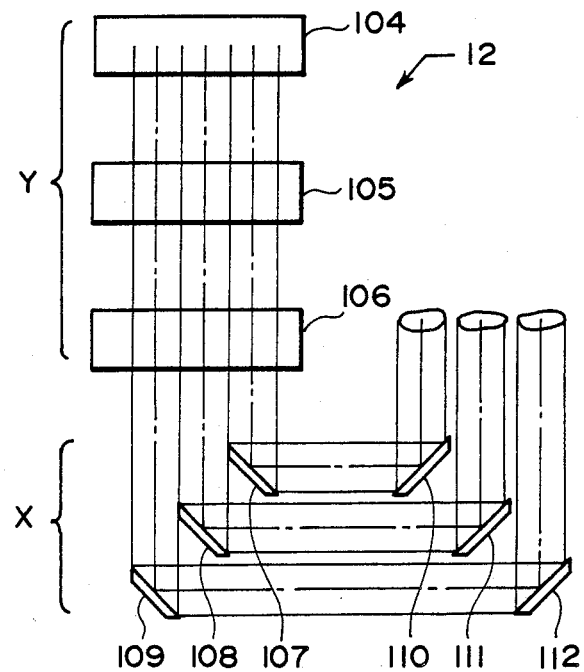
F I G. 10B

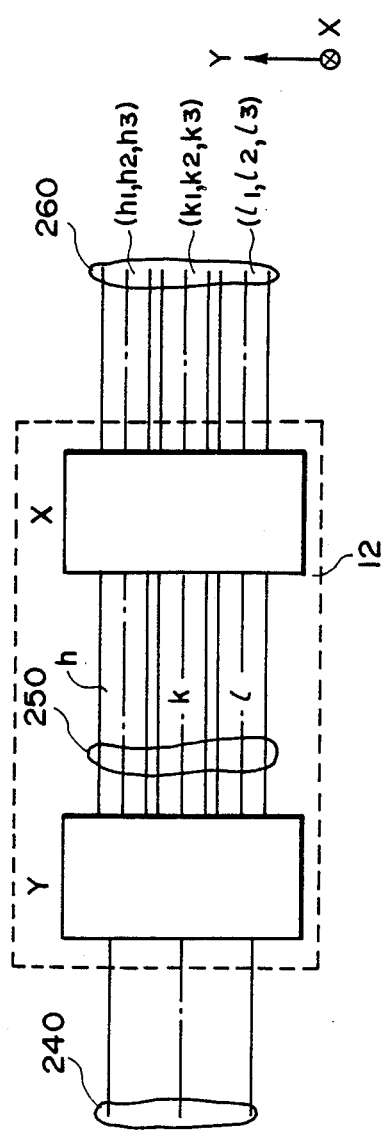
FIG. IIA
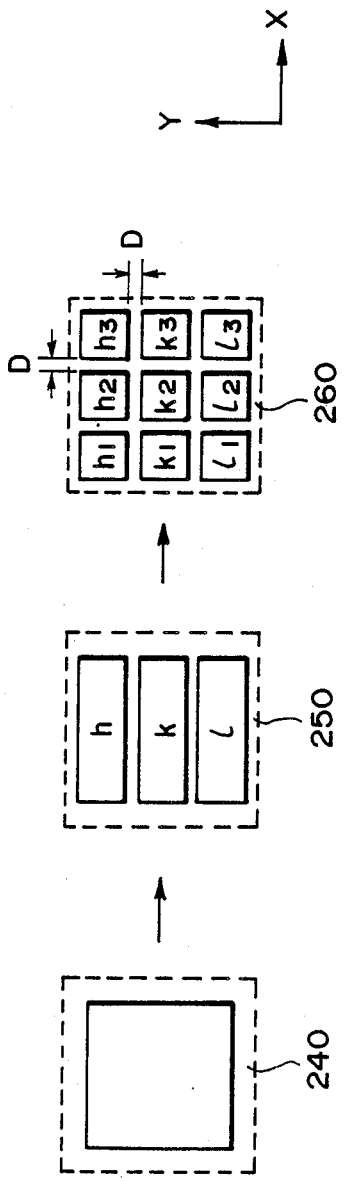
FIG. IIB

ILLUMINATING DEVICE

This application is a continuation of application Ser. No. 07/113,201 filed Oct. 27, 1987, now abandoned.

FIELD OF THE INVENTION AND RELATED ART

This invention relates to an illumination device for illuminating an object such as a reticle used in the manufacture of semiconductor devices such as integrated circuits. More particularly, the invention is concerned with an illumination optical device suitable for use of a light source which supplies coherent light for the illumination. The illumination device of the present invention is particularly suitably usable, e.g., in an exposure system for projecting a pattern of a reticle upon a wafer by use of light supplied from a laser such as, for example, an excimer laser.

Projection exposure systems for use in the field of manufacture of semiconductor devices include an imaging optical system for transferring a pattern of a reticle onto a wafer. In order to assure a high resolving power of such an imaging optical system, an illumination system provided in the projection exposure system for illuminating the reticle should have a suitable coherency of illumination. As a parameter which determines such coherency of the illumination system, there is a coherence factor "$\sigma$" which, as is well known in the art, represents the ratio of the numerical aperture (NA) of the illumination system to the numerical aperture of the imaging optical system.

In traditional illumination devices using an Hg lamp or otherwise, an illumination optical system included therein is usually suitably designed so as to provide a desired coherence factor $\sigma$.

In other types of illumination devices which use a specific light source, such as a laser or the like, that can provide a light flux with a good directivity, it is known to attain desired coherency of illumination by converging light from a light source to form a light spot and by scanningly deflecting the light spot in the plane of a pupil of the imaging optical system by use of an optical scanning device (scanner). By the scan of the light spot, the coherence factor $\sigma$ is adjusted as desired, whereby required coherency of illumination is attained.

FIG. 1 schematically shows such an illumination device wherein a laser is used as a light source. This type of illumination device is disclosed in U.S. Pat. No. 4,373,744 and Published International Application, International Publication No. WO86/00427.

The illumination device shown in FIG. 1 is usable in a step-and-repeat type exposure apparatus, called "stepper", using a laser as a light source. As shown in FIG. 1, the illumination device includes a laser 1 such as, for example, an excimer laser provided as a light source; lenses L1 and L2 having a positive power; a pinhole member 2; an oscillatable or rotatable reflector Mr; and lenses L3 and L4 having a positive power. Denoted by a character A is the pupil plane of the lens L4 which is at the position of the first or front focal point of the lens L4.

Denoted by a character B in FIG. 1 is a surface which is to be irradiated with the light from the illumination device. The surface B is located at the position of the second or rear focal point of the lens L4. More specifically, where the focal length of the lens L4 is denoted by f4, the pupil plane A and the surface B to be irradiated are located at positions which are spaced, by a distance f4, from the front and rear principal planes of the lens L4, respectively.

In FIG. 1, the laser 1 produces a parallel light. The flux of light emitted from the laser 1 is converged by the lens L1 at the position of the pinhole member 2 and, thereafter, it is diverged. The diverging light is incident upon the lens L2 which, in this example, functions as a collimator lens. Consequently, the diverging light is transformed into a parallel light flux which is directed to the reflector Mr. The flux of light as reflected by the reflector Mr is concentrated by the lens L3 at the pupil plane A. On the other hand, by oscillating or rotationally moving the reflector Mr in the directions denoted by the curved double-headed arrow in FIG. 1, the light spot formed by the concentrated light is scanningly moved in the pupil plane A and in the direction denoted by x in FIG. 1. The light being scanningly deflected and converged upon the pupil plane A then enters into the lens L4, in the form of a diverging light flux. By this lens L4, the light flux is transformed into a parallel light flux. It will be understood that, at different moments, different light is incident upon the lens L4 due to the scanning deflection by the reflector Mr. Accordingly, for a certain time period, different light fluxes are sequentially transformed into parallel light fluxes which, as seen from FIG. 1, illuminate the same region in the surface B.

With the structure of the illumination device shown in FIG. 1, the flux of light emitted from the laser 1 is concentrated upon the pupil plane A while being scanned in the same plane by the scanning deflection by the reflector Mr. By this, the required coherency of illumination is attainable.

However, in the illumination device of the FIG. 1 example, it requires a large angle of rotation or oscillation of the reflection Mr to achieve a large scan area or range at the pupil plane A. This leads to the disadvantage of a prolonged scan time.

Accordingly, when an illumination device of the type described above is incorporated into a semiconductor device manufacturing exposure apparatus such as a stepper, using a laser such as an excimer laser, it requires a long time to scan the laser beam for the coherency control, which disadvantageously decreases the throughput of the manufacturing apparatus.

U.S Pat. No. 4,619,508 shows an illumination device of a different type, wherein a laser beam having a predetermined diameter, in section, is scanningly deflected and the thus scanned laser beam is incident upon a lens array, called G "fly's eye lens". The laser beam being scanned is divided by the lens array into plural light fluxes, and the divided light fluxes are superposed upon one another on the surface to be irradiated.

In this type of illumination device, however, a long time is necessary for the scan. That is, in this illumination device, a single light is scanningly deflected with respect to a light receiving surface of the fly's eye lens system as a whole. Therefore, in order to provide an increased angle of incidence of the light upon the fly's eye lens system, it is inevitable to enlarge the rotational angle of a reflector or otherwise by which the scanned light is provided. This results in a prolonged scan time.

As is well known, usually, a laser produces a coherent light flux. Thus, in a projection exposure system which uses a laser as an illumination source, there is a possibility of occurrence of an interference pattern or speckle pattern, formed by the coherent light, which significantly deteriorates the transferring or photoprinting performance of the exposure system. In the optical arrangement shown in FIG. 1 and in the illumination devices as disclosed in the aforementioned U.S. Pat. Nos. 4,373,744 and 4,619,508, the scan of the laser beam is effective to lower the time coherency. However, with these structures, it is not possible to satisfactorily suppress the effect of the interference pattern.

SUMMARY OF THE INVENTION

Accordingly, it is a primary object of the present invention to provide an illumination device which is capable of high-speed scanning of a light flux from an illumination source to thereby allow illumination of an object such as a reticle in a very short time.

It is another object of the present invention to provide an illumination device which is suitably usable in an exposure system and which can suppress the effect of an interference pattern, produced as a result of use of a coherent light flux, thereby to allow improvements in the pattern tranferring or photoprinting performance of the exposure system.

In accordance with one aspect of the present invention, to achieve one of or both of these objects, there is provided an illumination device which includes means for supplying light, means for forming plural light fluxes by use of the light, scanning means effective to scan the light fluxes substantially at the same time and optical means effective to superimpose the light fluxes, being scanned, upon one another on a surface to be irradiated.

According to one preferred form of the present invention, as will be described later, the illumination device is provided with means for supplying a coherent light flux, means for forming plural mutually incoherent light fluxes from the coherent light, scanning means for scanning the light fluxes substantially at the same time and optical means for superimposing the light fluxes, being scanned, upon one another on the surface to be irradiated.

In accordance with another preferred form of the present invention, the illumination device is provided with means for supplying light, scanning means having a transparent portion for deflecting the light by refraction, the transparent member being rotationally moved about an optical axis to thereby scan the light, and optical means for directing the light being scanned to the surface to be irradiated.

The illumination device according to the present invention is particularly suitably usable as a reticle illuminating device in a projection exposure system wherein a circuit pattern of a reticle is projected, in a reduced scale, upon a wafer by use of an imaging optical system.

Particularly, when an excimer laser or otherwise which is effective to supply a coherent light is used as an illumination source, the illumination device of the present invention is very effective to ensure desired coherency of illumination, illumination with uniform illuminance distribution and/or illumination in a very short time.

Moreover, the illumination device of the present invention permits, when it is used in a projection exposure system, significant improvements in the pattern transferring or photoprinting performance at the time of photoprinting of a circuit pattern in a reduced scale.

These and other objects, features and advantages of the present invention will become more apparent upon consideration of the following description of the preferred embodiments of the present invention taken in conjunction with the accompanying drawings.

BRIEF DESCRIPTION OF THE DRAWINGS

FIGS. 7A and 7B are schematic views, respectively, of an illumination device according to another embodiment of the present invention.

FIGS. 8A–8D are each schematic views, showing examples of the locus of scan as can be determined by scanning means included in the illumination device shown in FIGS. 7A and 7B.

FIGS. 10A and 10B are schematic views, respectively, showing a light dividing device included in the illumination device of the FIG. 9 embodiment.

FIGS. 11A and 11B are schematic views, respectively, for explaining the function of the light dividing device shown in FIGS. 10A and 10B.

DESCRIPTION OF THE PREERRED EMBODIMENTS

Figure 1:
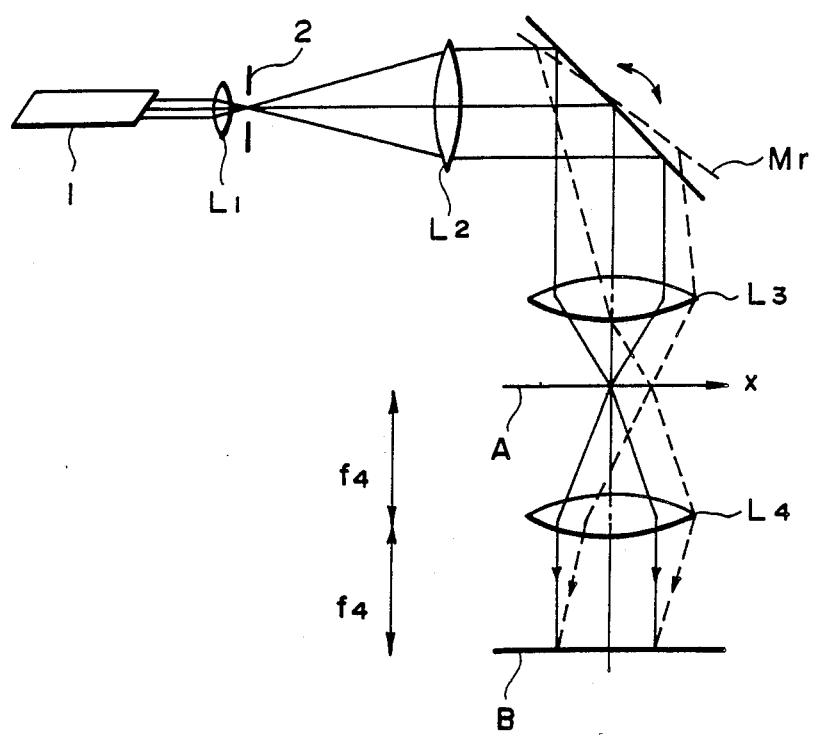
FIG. 1 is a schematic view showing an illumination device of a known type which uses a laser as a light source.
Figures 2, 3:
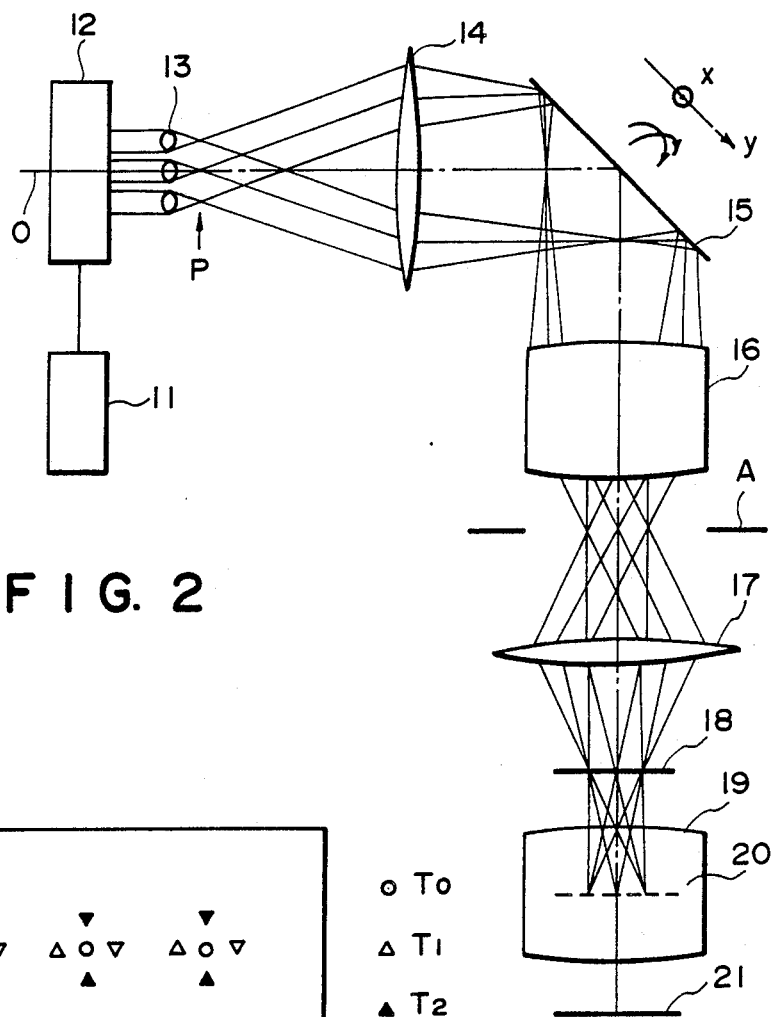
FIG. 2 is a schematic view of an illumination device according to one embodiment of the present invention.
FIG. 3 is a schematic illustration for explaining the manner of scan of light spots on the plane of a pupil.

Referring now to FIG. 2, there is shown an illumination device according to one embodiment of the present invention. The illumination device of the present embodiment is incorporated into a semiconductor device manufacturing step-and-repeat type reduction projection exposure apparatus, called a "stepper".

As shown in FIG. 2, the illumination device includes a light source 11 such as an excimer laser, for example, which is arranged to produce a flux of coherent light. The device further includes a light dividing device 12 which is arranged to divide the coherent light emitted from the light source 11 into a plurality of light fluxes and also is arranged to emit the divided light fluxes in a state in which they are mutually incoherent. The illumination device further includes a fly's eye lens system 13 which comprises plural lens elements, and a condenser lens 14 whose first or front focal point is coincident with the second or rear focal point of the fly's eye lens system 13, at the position indicated by an arrow P in FIG. 2. The illumination device further includes a reflector 15 which is rotationally movable in predetermined directions, and an f−θ lens which is telecentric on the light emitting side. Denoted by character A in FIG. 2 is a plane which is optically conjugate with an entrance pupil of an imaging optical system (which will be described later). Hereinafter, the plane A will also be referred to as a "pupil A". Each light flux passing through the f−θ lens 16 is concentrated upon the pupil A thereby to form a light spot on the pupil A. Denoted at 17 is a condensing optical system, and denoted by numeral 18 is a reticle which is provided with a circuit pattern. Denoted at 19 is the aforesaid imaging optical system which is adapted to image the circuit pattern of the reticle 18 upon a predetermined imaging plane in a reduced scale. The imaging optical system 19 has an entrance pupil, denoted at 20 in FIG. 2, which pupil is in an optically conjugate relation with the above-described pupil A. Denoted by numeral 21 is a wafer on which the circuit pattern of the reticle 18 is projected in a reduced scale by means of the imaging optical system 19. The wafer 21 is placed at a position which is optically conjugate with the reticle 18 with respect to the imaging optical system 19. Reference character O denotes the optical axis of the whole optical system as illustrated. Reference characters x and y denote the axes of the rotational movement of the reflector 15, respectively.

The parallel and coherent light emitted from the light source 11 is incident on the light dividing device 12 by which the coherent light is divided into a plurality of light fluxes. Additionally, in the light dividing device 12, a predetermined optical path difference (a difference in the optical path length) is established between or among the divided light fluxes. As a result, plural light fluxes are emitted from the light dividing device 12 in a state in which they are mutually incoherent. Namely, the light dividing device 12 produces incoherent light fluxes. Details of the light dividing device 12 will be described later, in conjunction with some of the drawings.

The parallel and mutually incoherent light fluxes as emitted from the light dividing device 12 are incident upon the fly's eye lens system 13. The number of the lens elements constituting the fly's eye lens system 13 and the number of the parallel light fluxes are in a one-to-one relation, such that each light flux enters into a corresponding one of the lens elements of the fly's eye lens system 13. Each light flux incident upon the corresponding lens element of the fly's eye lens system 13 is focused upon the second or rear focal point of the fly's eye lens system 13 by the action thereof. It should be noted here that, although in the present embodiment each light flux from the light dividing device 12 is focused upon the rear focal point of the fly's eye lens system 13 because of the fact that each light flux comprises a parallel light flux , the point of convergence is not limited to the focal point position denoted at P in FIG. 2. Each light flux may be focused at any other position. That is, if a given light flux emitted from the light dividing device 12 is converging or diverging, it is not focused upon the focal point of the fly's eye lens system 13.

In this embodiment, the fly's eye lens system 13 comprises lens elements each having a positive refracting power. However, the fly's eye lens system may be provided by lens elements each comprising a concave lens or otherwise having a negative refracting power.

The rear focal point of the fly's eye lens system 13, namely the position of convergence of each light flux denoted at P in FIG. 2, is coincident with the front focal point of the condenser lens 14. For this reason, each light flux having been focused upon the focal point of the fly's eye lens system 13 enters into the condenser lens 14 in the form of a diverging light flux and, by this condenser lens 14, each divergent light flux incident thereupon is transformed into a parallel light flux. However, it should be noted that the plural light fluxes as obtainable by the condenser lens 14 are inclined with different angles with respect to the optical axis O, such that these parallel light fluxes are incident upon the reflector 15 at different angles.

Each of the parallel light fluxes as reflected by the reflector 15 is directed to the f−θ lens 16 by which it is converged upon the rear focal plane of the f−θ lens 16, namely the pupil A. Thus, as a result of incidence of each parallel light flux upon the f−θ lens 16, a corresponding light spot is formed on the plane of the pupil A and at such position that corresponds to the angle of incidence of the light flux upon the f−θ lens 16. Since, in this embodiment, the f−θ lens 16 is made telecentric on the light emitting side, the chief ray of each light flux as converged by the f−θ lens 16 is parallel to the optical axis O.

In the manner described hereinbefore, a plurality of light spots (or spot images) are formed on the pupil A, by using incoherent light fluxes as produced by the light dividing device 12.

When the reflector 15 is rotationally moved about the two axes x and y so as to scanningly deflect the parallel light fluxes, the light spots formed on the pupil A are scanningly moved two-dimensionally along the plane of the pupil A. FIG. 3 schematically shows such two-dimensional scanning of the light spots in the pupil A plane. The symbols depicted in this Figure represent the positions of the light spots, being scanned, at different times T0, T1, T2, T3 and T4. It will be understood that the light spots formed at different times are mutually incoherent and also that the light spots formed at the same time are mutually incoherent, too, as described hereinbefore. Namely, all the light spots formed on the pupil A within a particular time period consist of mutually incoherent light spots. This means that a plurality of point light sources (or images) providing incoherent lights and capable of being scanned, are formed on the pupil A plane. Thus, a light source having a substantial extent (namely, a surface illuminant) and providing an incoherent light is attained on the pupil A plane.

It will be readily understood from FIGS. 2 and 3 and from the foregoing description that the point light sources (or light source images), namely the light spots, formed on the pupil A plane are scanned individually. For this reason, only a limited and small deflection of each light flux that forms a light spot is needed. Accordingly, only a limited and small rotational angle is necessary for the rotational movement of the reflector 15, which allows reduction in the scan time even when scanning in a large area or range is required.

Referring back to FIG. 2, the light fluxes from the light spots formed on the pupil A enter the condensing optical system 17 each in the form of a diverging light flux. By this condensing optical system 17, the diverging light fluxes are converged and superimposed upon one another to thereby illuminate the reticle 18. The circuit pattern of the reticle 18, illuminated in this manner, is imaged upon the wafer 21 by means of the imaging optical system 19 and at a predetermined imaging magnification, such that the circuit pattern of the reticle 18 is transferred onto the wafer 21.

Since the entrance pupil 20 of the imaging optical system 19 is in an optically conjugate relation with the pupil A, plural incoherent light spots (light source images) are formed at the entrance pupil 20 of the imaging optical system 19. Thus, the wafer 21 is illuminated in the "Kohler illumination" fashion. By the Kohler illumination of the wafer 21, any unevenness in the illuminance distribution which might be caused by the luminance distribution of the light source images (light spots) can be avoided. If, however, the luminance distribution of the light source images is not critical in practical use, the Kohler illumination is not always necessary. From this, it is seen that the position of each light spot formed by the $f-\theta$ lens 16 is not limited to the plane of the pupil A. The light spots may be formed at any other position in the path of the illumination light.

In the present embodiment, each of the parallel light fluxes scanningly reflected by the moving reflector 15 is concentrated by the $f-\theta$ lens 16 so that a corresponding light spot formed on the pupil A is moved at a constant speed. Further, all the light fluxes from all the light spots being scanned in the pupil A plane illuminate the same region of the reticle 18 continuously. Therefore, for a particular illumination region (a region to be illuminated) which is predetermined, the illumination light can be efficiently directed to such illumination region. It is to be noted that, if the illumination light has a sufficient intensity and the efficiency of use of the illumination light is not a critical matter, the $f-\theta$ lens 16 may be replaced by an ordinary condensing optical system such as, for example, an $f-\tan\theta$ lens system. Similarly, the refracting power (focal length) of the condensing optical system, the interval between the reticle 18 and the plane in which the light spots are formed, or other factors may be suitably determined in accordance with the specifications of an exposure apparatus to be manufactured. For example, when the imaging optical system 19 to be used should be provided by an optical system which is telecentric both on the light entrance side (object side) and on the light exit side (image side), each of the interval between the condensing optical system 17 and the plane of the pupil A on which the light spots are formed and the interval between the condensing optical system 17 and the reticle 18 should preferably be equal to the focal length (f) of the condensing optical system 17. This is preferable from the standpoint of the illumination efficiency, for example.

While in the present embodiment the rotationally movable reflector 15 is used to scanningly deflect the parallel light beams to thereby scan the light spots, the scanning means is not limited to such a rotationally movable reflector. For example, in place of the reflector 15, an electro-optic light deflector comprising an electro-optic crystal or otherwise, an acousto-optical light deflector comprising an elastic wave transmitting medium or otherwise, a rotatable prism (which will be described later) or any other suitable means may be disposed in the path of the parallel light fluxes so as to scanningly deflect them.

It is a possible alternative that a corresponding number of electro-optic light deflectors or acousto-optic light deflectors are disposed in respective paths of the parallel light fluxes from the light dividing device 12 (FIG. 2) so that each light flux is independently deflected and scanned by a corresponding light deflector. In this case, an increased number of light deflectors are necessary. However, as compared to a case when a single light deflector of this type is provided at the position of the reflector 15 shown in FIG. 2, each light deflector can be made compact and small in size with the advantages of ease of manufacture of the light deflector and reduction in size of the illumination device as a whole.

In summary, as for the means for scanning the light fluxes, any structure may be used provided that it can form, on the same plane, optical spots of incoherent light by using light from a certain coherent light source and that it can scan the formed light spots.

Further, in the present invention, it is not necessary that the optical spots of incoherent light, to be formed on the same plane, are formed exactly at the same moment. It is permissible that the light spots are formed in a time period which is so short that it can be regarded as "the same time". For example, it is within the scope of the present invention that, in the FIG. 2 embodiment, an electro-optic light deflector or an acousto-optic light deflector is provided between the light source 11 and the condenser lens 14 in place of the light dividing device 12, so as to deflect the coherent light from the light source 11 at different timings and angles thereby to sequentially converge the light upon different points adjacent the position P, such that the light fluxes from the thus formed point light sources which are mutually incoherent are then directed by the condenser lens 14 to the rotationally moving reflector 15. It will be readily understood that, in this case, the speed of (scanning) deflection of the coherent light by the light deflector is remarkably higher than the speed of scan of the incoherent light fluxes by the reflector 15. Also, by suitably setting the speed of scanning deflection by the light deflector such as an electro-optic or acousto-optic light deflector, it is easy to produce incoherent light fluxes by using the coherent light from the light source.

In the illumination device of the present embodiment and once its optical arrangement is determined, for example, such as illustrated in FIG. 2, the coherency of illumination is determined mainly dependent upon the scan range for the light spots. Accordingly, by controlling the scanning means such as the illustrated reflector to thereby determine a suitable scan range for the light spots, desired coherency of illumination is attainable. Further, since a single light flux is transformed into plural light fluxes forming light spots and these light fluxes are scanningly deflected to scan the light spots in a particular scan range, the scanning deflection angle for each light flux can be made very small with the result that only a limited and small rotational angle is required for the rotational movement of the reflector. In other words, in an extraordinarily short time, illumination of desired coherency is attainable.

Figure 4A:
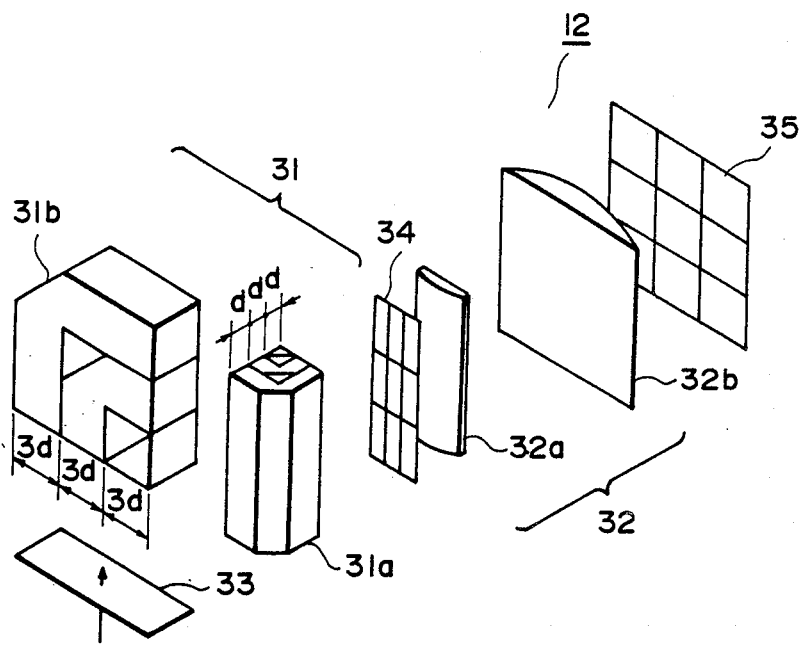
FIG. 4A is a schematic view showing details of a light dividing device included in the illumination device of the FIG. 2 embodiment.
Figures 4B, 4C:
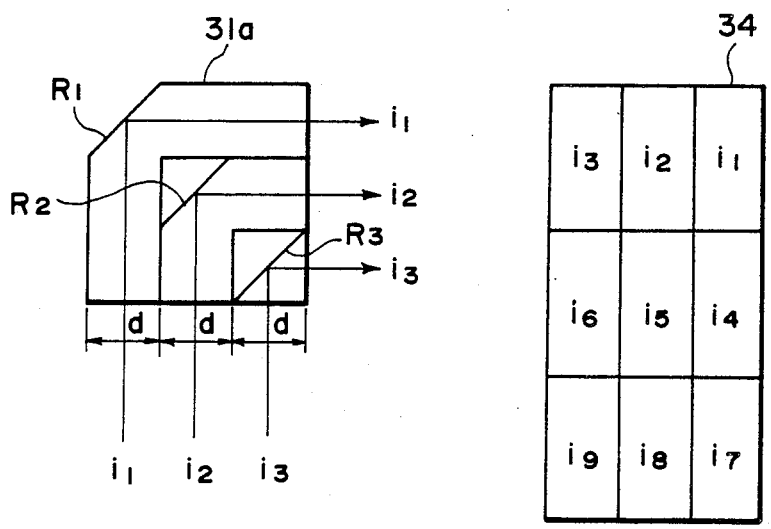
FIG. 4B is a schematic view showing the structure and function of a light dividing prism included in the light dividing device of FIG. 4A.
FIG. 4C is a schematic view explaining the manner of division of light.
Figure 4D:
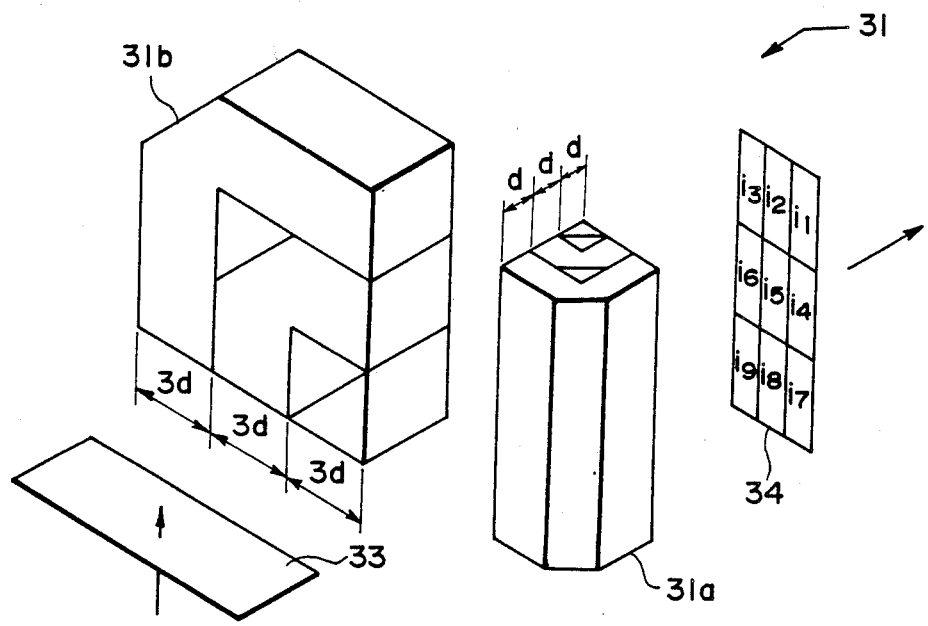
FIG. 4D is an enlarged and schematic view showing a modified form of the light dividing device.

Referring now to FIGS. 4A-4D, details of the structure of the light dividing device 12 will be described. Of these Figures, FIG. 4A is a schematic and perspective view showing the entire dividing device. FIG. 4B is a view explaining the function of a light dividing prism which is one component of the light dividing device 12. FIG. 4C is a schematic view showing an array of the light fluxes having been divided by the light dividing device. FIG. 4D is an enlarged schematic view showing a modified form wherein no beam expander is provided.

In FIGS. 4A–4C, denoted generally by reference numeral 31 is an optical system which is arranged to divide a coherent light flux and transform it into plural incoherent lights. Also, denoted generally by reference numeral 32 is a beam expander. The optical system 31 includes dividing prisms 31a and 31b, while the beam expander 32 includes cylindrical lenses 32a and 32b. Reference numerals 33, 34 and 35 denote, respectively, sections of light at different positions along an optical path defined in the light dividing device 12 of the present embodiment. Of these, reference numeral 33 denotes the section of a parallel light emitted from a light source 11 (FIG. 2). Reference numeral 34 denotes the portion of the parallel light having passed through the optical system 31. Reference numeral 35 denotes the portion of light emitted from the beam expander 32. The symbols "d" and "3d" represent, respectively, the sizes of light entrance surfaces and light exit surfaces of the dividing prisms 31a and 31b, wherein $3d = d \times 3$. Also, the symbols "$i_1$", "$i_2$", ... and "$i_9$" denote the divided light fluxes.

Each of the dividing prisms 31a and 31b has three light entrance surfaces and three light exit surfaces. Each of the light entrance surfaces and the light exit surfaces of the dividing prism 31a has an oblong shape, whereas each of the light entrance surfaces and the light exit surfaces of the dividing prism 31b has a square shape. Although these two dividing prisms are different in size and configuration, they function essentially in the same way as to the division of light and the transformation of light into incoherent light. The principle of the light division and incoherence transformation will now be described in detail.

The view of FIG. 4B shows the cross-section of the dividing prism 31a, cut along a plane orthogonally intersecting the longitudinal or lengthwise side of the prism 31a, and schematically illustrates the paths of light passing through the prism 31a. Each parallel light flux incident upon the dividing prism 31a is divided or separated by the three light entrance surfaces of the prism 31a (each having a widthwise size d and a longitudinal size $9d = 3d \times 3$), and the divided three light fluxes are directed along different paths, respectively. These three optical paths are parallel to each other, as seen in FIG. 4B. Also, in these optical paths and at positions which are spaced from the respective light entrance surfaces by different distances, reflecting surfaces R1, R2 and R3 are formed. Thus, the advancing direction of each of the three light fluxes, advancing along respective optical paths, is deflected by 90 degrees, in this embodiment, by a corresponding one of the three reflecting surfaces R1–R3 disposed in the three optical paths. After the reflection, the three light fluxes are emitted from the three light exit surfaces of the dividing prism 31a as the three divided light fluxes denoted by $i_1$, $i_2$ and $i_3$.

It will be readily understood that optical path differences (differences in the optical path length) are defined for the three light fluxes $i_1$–$i_3$ having passed through the dividing prism 31a. When the optical path length defined in the prism 31a for the light flux $i_n$ is denoted by $j_n$ and the refractive index of the prism 31a is denoted by n, then the optical path differences for the light fluxes $i_1$–$i_3$ are given by the following equations:

$$j_1 - j_2 = 2nd$$

$$j_2 - j_3 = 4nd$$

It is seen therefrom that, if the optical path difference "2nd" is longer than the coherence length of the coherent light incident upon the prism 31a, the divided light fluxes $i_1$–$i_3$ become mutually incoherent (i.e. they consist of incoherent lights). For example, when a KrF excimer laser providing a wave bandwidth of 0.005 nm is used as a light source, the coherence length of the laser beam from such an excimer laser is 12 mm. Therefore, when a glass material having a refractive index $n = 1.5$ is used as the material of the dividing prism, the incoherence transformation is attainable if the size d shown in FIG. 4A is not less than 4 mm.

In the present embodiment, two dividing prisms each having the function having been described with reference to FIG. 4B are used to provide the arrangement shown in FIG. 4A. This assures that the single light flux 33 which consists of a coherent light is divided first by the dividing prism 31b into three light fluxes and, additionally, each of the three divided light fluxes is again divided by the dividing prism 31a into three light fluxes. Thus, finally there are produced nine divided light fluxes $i_1$–$i_9$ such as illustrated in FIG. 4C. Of course, these light fluxes $i_1$–$i_9$ are provided by mutually incoherent lights, in accordance with the above-described principle. When the optical path length for a light flux $i_m$ is denoted by $j_m$, there is established an optical path difference for each light flux with respect to the light flux $i_1$, which difference can be expressed as follows:

$$j_1 - j_m = 2n \cdot m \cdot d$$

The function of the light dividing device 12 shown in FIG. 4A can be summarized as follows.

The coherent light flux 33 emitted from a laser light source such as an excimer laser and having an oblong sectional shape is first directed to the optical system 31. The dividing prism 31b of the optical system 31 functions to divide the light flux 33, into three, along the lengthwise direction of the oblong section. Thus, three light fluxes, corresponding respectively to the three sets of light fluxes ($i_1$, $i_2$, $i_3$), ($i_4$, $i_5$, $i_6$) and ($i_7$, $i_8$, $i_9$), are emitted from the dividing prism 31b with their advancing directions being deflected by 90 degrees. Subsequently, these three light fluxes enter the dividing prism 31a wherein each light flux is divided into three along the widthwise direction of the oblong-shaped section of the light flux 33.

As a result, the light emitted from the dividing prism 31a and denoted generally by reference numeral 34 consists of nine divided light fluxes $i_1$–$i_9$ shown in FIG. 4C. Also, the sectional shape of the emitted light 34, as a whole, is still oblong, as shown in FIG. 4C.

These nine light fluxes consist of mutually incoherent lights, as has been described with reference to FIG. 4B.

The light 34 emitted from the dividing prism 31a and comprising nine light fluxes $i_1$–$i_9$ is directed to the beam expander 32. Each of the cylindrical lenses 32a and 32b, forming the beam expander 32, has a refracting power only in the direction corresponding to the widthwise direction of the oblong-shaped section of the light 34. Thus, by passage through the beam expander 32, the sectional shape of the light 34 is changed so that a light flux denoted at 35 and having a square sectional shape is produced.

In the manner described hereinbefore, the coherent light incident upon the light dividing device 12 is divided into plural light fluxes and, also, the divided light fluxes are emitted therefrom as mutually incoherent light fluxes. These incoherent light fluxes are directed to the fly's eye lens system 13 shown in FIG. 2.

The light dividing device of the example shown in FIGS. 4A-4C is arranged, as described, so that particular optical path differences are defined within the dividing prisms 31a and 31b for the incoherence transformation purpose. If, therefore, the material of the dividing prism has absorbency, there occurs an undesirable difference in the quantity among the divided light fluxes. If it is desired to avoid such a problem, an image rotator prism (not shown) may be provided so that the light from the beam expander 32 enters the image rotator prism. By rotating the image rotator prism, the unevenness in the quantity among the light fluxes can be avoided.

FIG. 4D shows a modified form of the light dividing device of FIG. 4A, and the same reference numerals are assigned to corresponding elements. In the FIG. 4D example, the beam expander 32 of the FIG. 4A example is omitted. The optical system denoted generally at 31 has the same structure and function as those of the optical system 31 shown in FIG. 4A. Also, in the FIG. 4D example, the sectional shape of the incident light flux 33 is retained when it is emitted from the light dividing device.

The coherent light flux 33 emitted from a laser light source such as an excimer laser and having an oblong sectional shape is first directed to the optical system 31. The dividing prism 31b of the optical system 31 functions to divide the light flux 33, into three, along the lengthwise direction of the oblong section. Thus, three light fluxes, corresponding respectively to the three sets of lights ($i_1$, $i_2$, $i_3$), ($i_4$, $i_5$, $i_6$) and ($i_7$, $i_8$, $i_9$), are emitted from the dividing prism 31b with their advancing directions being deflected by 90 degrees. Subsequently, these three light fluxes enter the dividing prism 31a wherein each light flux is divided into three along the widthwise direction of the oblong-shaped section of the light flux 33.

As a result, the light emitted from the dividing prism 31a and denoted generally by reference numeral 34 consists of nine, two-dimensionally divided light fluxes $i_1$-$i_9$ shown in FIG. 4C. Also, the sectional shape of the emitted light 34, as a whole, is still oblong, as shown in FIG. 4C.

Since predetermined optical path differences are established within the dividing prisms 31b and 31a for the divided light fluxes $i_1$-$i_9$, these light fluxes are emitted in the form of mutually incoherent lights.

In the present embodiment, similar to the FIG. 4A embodiment, two dividing prisms 31a and 31b are arranged such that their light entrance surfaces are placed in two orthogonally extending planes while their light exit surfaces are also placed in two orthogonally extending planes, with the result of two-dimensional division of the coherent light 33.

In the present embodiment, no beam expander is used as compared with the FIG. 4A embodiment, and therefore the cross-sectional size or shape of the light flux 33 is not changed by the passage through the light division and incoherence transformation optical system.

In the dividing prisms 31a and 31b of the FIGS. 4A-4D embodiment, each of the reflection surfaces is set with an angle $\alpha=45$ degrees. Thus, the advancing direction of each coherent light flux impinging on the reflection surface is deflected by 90 degrees. Each of the light entrance surfaces and the light exit surfaces of the dividing prisms may be coated with an anti-reflection film. This is effective to reduce the loss of light quantity. Also, the number of division of the coherent light 33 (which is "nine" in the foregoing embodiments) may be easily changed as desired, for example, by increasing the number of the prism elements constituting the dividing prism and/or the number of the reflection surfaces or otherwise, or by combining a suitable number of dividing prisms. The optical path difference or differences to be applied to the divided light fluxes are easily determined by suitably setting the angle of each reflection surface, as described hereinbefore, once the material of the prism, the property or type of the coherent light to be used, the cross-sectional diameter of the light and the number of the light fluxes to be formed by the division are determined.

In the light dividing device shown in FIGS. 4A-4D, both the division of light and the incoherence transformation are achieved in the same device. However, they may be attained by separate devices. Therefore, as for the elements constituting such light dividing and incoherence transforming means, many varieties of optical elements, other than the described dividing prism, such as light transmitting members (such as fibers), reflectors, half mirrors or otherwise may be used. Also, when one or more dividing prisms are used, the structure thereof is not limited to the disclosed examples shown in FIGS. 4A-4D.

The illumination device of the present invention is particularly suitably applicable to a system for illuminating an object with a desired coherency of illumination and by use of a coherent light source, and the present invention if it is applied allows supply of a predetermined quantity of light to the object, to be irradiated, in a very short time and with the desired coherency of illumination. Therefore, remarkable advantages are attainable when the illumination device is used as a reticle or mask illuminating device in a semiconductor device manufacturing exposure apparatus having a coherent light source such as an excimer laser.

In the illumination device according to the present embodiment, as has hitherto been described, a plurality of light spots are formed substantially on the same plane and these light spots are scanned at the same time, the lights from the light spots being scanned and then directed to a surface, to be irradiated, by use of a condensing optical system. This arrangement is very effective because, even for a large scan area, only the scan of the light spots in a very short time is sufficient to direct the light to the surface to be irradiated and the irradiation of the surface is achieved with a desired coherency of illumination. Therefore, by applying the present invention to an illumination device in a stepper having a coherent light source such as an excimer laser, it is possible to provide a high-performance and high-throughput stepper.

Further, it should be noted that, in the illumination device of the present embodiment, coherent light is divided and transformed into a plurality of incoherent light beams forming light spots and, additionally, these light spots are scanned. Namely, in the present embodiment, the incoherence transformation is also accomplished with respect to time. Therefore, the adverse effect of the interference pattern formed by the coherent light can be suppressed, with the result that the illumination can be achieved with a uniform illuminance distribution.

Figure 5A:
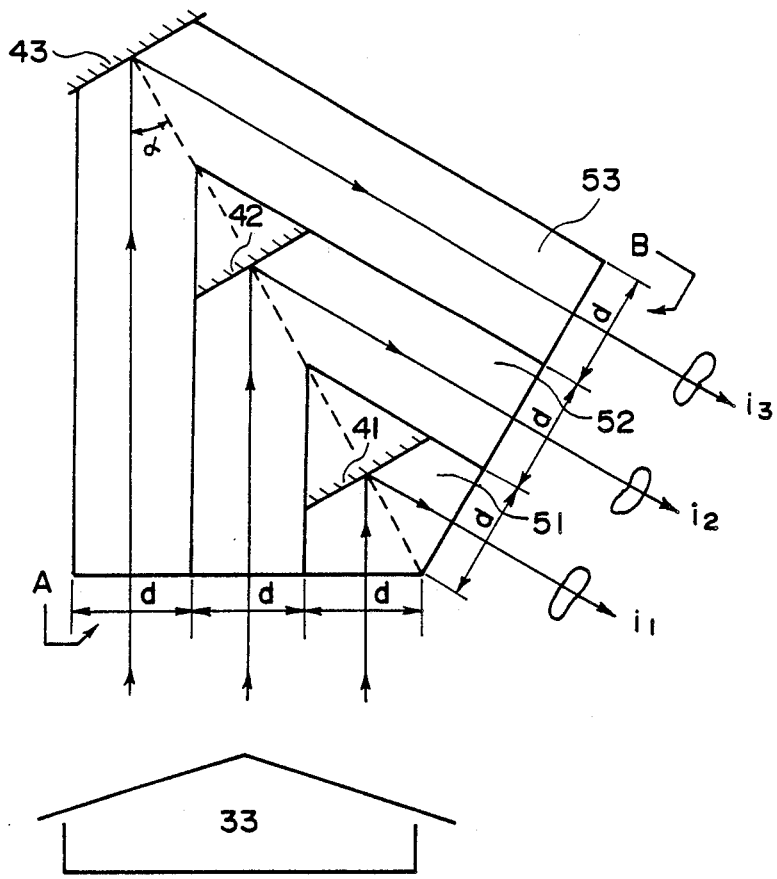
FIGS. 5A and 5B are schematic views, respectively, showing another example of a light dividing device.

Referring now to FIG. 5A, there is shown another embodiment of the light dividing device usable in the present invention. The whole structure of the light dividing device of the present embodiment has a predetermined height in the direction perpendicular to the sheet of the drawing, and is formed by a pentagonal pole-like member having the cross-sectional shape as illustrated.

In FIG. 5A, a first prism 51, a second prism 52 and a third prism 53 each have a light entrance surface and a light exit surface. The prisms 51-53 are bonded so that their light entrance surfaces cooperate to form a light entrance surface denoted at A while their light exit surfaces cooperate to define a light exit surface denoted at B. Reflecting surfaces 41, 42 and 43 are formed on the first prism 51, the second prism 52 and the third prism 53, respectively. Each reflection surface functions to reflect, with a predetermined angle ($=2\alpha$), a light flux having been projected upon the light entrance surface of a corresponding one of the prisms, toward the light exit surface thereof. Schematically illustrated at 33 is a coherent parallel light flux which is going to be incident upon the light dividing device. The light flux 33 is incident at a right angle upon the light entrance surface A. Symbols $i_1$, $i_2$ and $i_3$ denote, respectively, plural light fluxes which have been divided by the dividing device and projected from the light exit surface B in directions different from the advancing direction of the coherent light flux 33. Further, within the first to third prisms, predetermined optical path differences are established for the light fluxes $i_1$-$i_3$ and, for this reason, the light fluxes $i_1$-$i_3$ consist of mutually incoherent light fluxes.

Each of the light entrance surfaces and the light exit surfaces of the prisms 51-53 has a width d. Accordingly, each of the light entrance surface A and the light exit surface B of the light dividing device has a width $3d$. Further, in this embodiment, the width or diameter in section of the coherent light flux 33, which is going to be incident upon the light dividing device, is restricted approximately to a value which is equal to "3d" in accordance with the width of the light entrance surface A. This is only for the efficient utilization of light. Practically, the light flux of any diameter may be projected upon the light dividing device.

The prisms 51-53 are arranged such that, when the prism assembly is divided along a broken line in FIG. 5A into halves of a light entrance side and a light exit side, each of the bonding surfaces between the prisms 51 and 52 and between the prisms 52 and 53 extends, in the light entrance side half, parallel to the advancing direction of the coherent light flux 33, whereas in the light exit side half each bonding surface extends parallel to the advancing direction of the divided light fluxes $i_1$-$i_3$ having been reflected by the reflection surfaces or films 41-43.

Each of the reflection surfaces 41-43 in the prisms 51-53 is set so that an angle $\alpha$ is defined between the normal to the reflection surface and the advancing direction of the coherent light flux 33. Accordingly, each of the divided light fluxes $i_1$-$i_3$ is reflected in the direction which depends on the angle $\alpha$, namely in a direction which forms an angle $2\alpha$ with respect to the direction of incidence. Also, as will be described later, each optical path difference $\Delta j$ to be defined for a coorresponding one of the divided light fluxes $i_1$-$i_3$, depends upon the angle $\alpha$.

The light dividing device as described is disposed in the path of the coherent light flux 33, and the light flux 33 is projected upon the dividing device. The optical path of the coherent light flux 33 is divided, substantially into three, by the light entrance surfaces of the prisms 51-53, forming the light entrance surface A. The light fluxes traveling along three optical paths, respectively, defined in the prisms 51-53, respectively, are reflected by the reflection surfaces 41-43, respectively, which are formed in the prisms 51-53 and are disposed at different distances from the light entrance surface A. The light fluxes reflected by the reflection surfaces 41-43, respectively, advance in the prisms 51-53, respectively, and finally they are emitted from the light exit surface B, in the form of three divided light fluxes $i_1$-$i_3$ which have traveled through different optical path lengths.

If it is assumed that the prisms 51-53 are made of the same material having a refractive index n and that the optical path length for a light flux $i_m$ (m = 1, 2 or 3), from the light entrance surface A to the light exit surface B is denoted by $j_m$, then the optical path difference $\Delta j$ between adjacent light fluxes can be expressed as follows:

$$\begin{aligned} \Delta j &= j_3 - j_2 \\ &= j_2 - j_1 \\ &= 2nd/\tan\alpha \end{aligned}$$

From this, it is seen that the optical path difference to be defined between or among the divided light fluxes can be controlled by use of three parameters n, d and $\alpha$. Since these parameters n, d and $\alpha$ can be easily changed, a desired optical path difference can be easily attained with a compact and simple device, such as illustrated, to thereby decrease the coherency of the divided light fluxes. Namely, the parameters n, d and $\alpha$ may be suitably set so that the optical path difference $\Delta j$ is greater than the coherence length of the light 33 used.

Figure 5B:
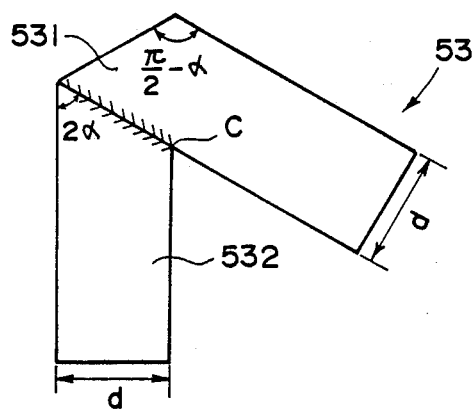

FIG. 5B shows an example of a prism usable in the light dividing device of the FIG. 5A embodiment. In this particular example, the prism shown in FIG. 5B is usable as the prism 53 shown in FIG. 5A.

In FIG. 5B, the prism 53 includes a first optical member 531 and a second optical member 532 each having transmissibility to light. The first and second optical members 531 and 532 have the same refractive index. Each of the optical members 531 and 532 has a trapezoidal cross-sectional shape such as illustrated, so that it can be manufactured with simple machining such as by forming a slant on a square pole member. Further, the prism 53 can be easily fabricated by bonding, by vacuum bonding, the slant of the optical member 532 to a portion of the bottom surface of the optical member 531.

Figure 6:
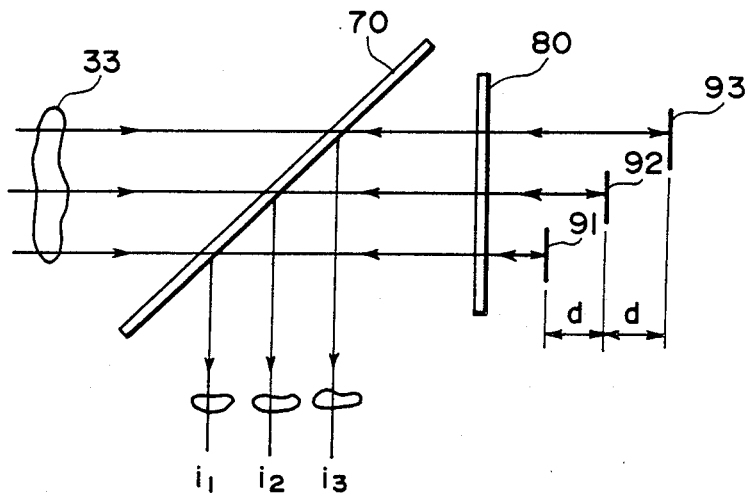
FIG. 6 is a schematic view of a further example of a light dividing device.

FIG. 6 schematically shows another embodiment of the light dividing device usable in the present invention. In FIG. 6, reference numeral 33 denotes a coherent light flux while symbols $i_1$, $i_2$ and $i_3$ denote divided incoherent light fluxes, respectively, as in the foregoing embodiments. The device of the present embodiment includes a polarization beam splitter 70, a quarter waveplate 80 and total reflection mirrors 91-93. The mirrors 91-93 are disposed with the same interval d with respect to the advancing direction of the coherent light flux.

As compared with the foregoing embodiments, the light dividing device of the present embodiment is not constituted by prisms. Rather, the device of the present embodiment is constituted by the polarization beam splitter 70, the quarter waveplate 80 and the total reflection mirrors 91-93. The mirrors 91-93 are each disposed to cross the path of the coherent light flux 33 and have a reflection surface perpendicular to the advancing direction of the coherent light flux 33. Accordingly, the coherent light as totally reflected by the mirrors 91-93 goes back along its oncoming path. At this time, the flux 33 is divided by the mirrors 91-93 into three light fluxes $i_1-i_3$.

The light dividing device of the present embodiment is used with linearly polarized light. For example, when the coherent light flux 33 consists of P-polarized light, the flux of the P-polarized light passes through the polarization beam splitter 70 and is transformed into circularly polarized light by means of the quarter waveplate 80. Then, the flux of the circularly polarized light is incident upon the total reflection mirrors 91-93 and reflected thereby. At this time, the flux is divided into three. Each of the fluxes of circularly polarized light, reflected from the mirrors 91-93, passes again through the quarter waveplate 80 by which it is transformed into a flux of S-polarized light. The light fluxes $i_1-i_3$ each now comprising S-polarized light are reflected by the polarization beam splitter 70 so that the optical path is deflected by 90 degrees, and these light fluxes are projected from the device in these deflected directions. By using a polarization beam splitter and a quarter waveplate with linearly polarized light, in combination, any loss of light can be avoided with a resultant advantage of efficient utilization of the coherent light. Where the coherent light such as at 33 has a sufficient intensity so that the loss of light is not a critical matter, the polarization beam splitter 70 and the quarter waveplate 80 may be simply replaced by a half mirror.

Since, in the present embodiment, the total reflection mirrors 91-93 are not inclined with respect to the advancing direction of the coherent light flux 33 and since the refractive index of air is 1, the optical path difference defined for the divided light fluxes $i_1-i_3$ can be represented simply by "2d". Therefore, the total reflection mirrors 91-93 may be simply disposed so that the value "2d" is greater than the coherence length of the coherent light used.

The light dividing device of the present embodiment does not require use of precise optical elements such as prisms and has a very simple structure described hereinbefore. Therefore, the present embodiment is very effective for practical use.

Referring now to FIGS. 7A and 7B, there is shown an illumination device according to another embodiment of the present invention, wherein the illumination device is incorporated into a semiconductor device manufacturing projection exposure apparatus.

As shown in these Figures, the device includes a light source 11 such as an excimer laser or otherwise, which emits a coherent light flux. The device further includes a scanning system which comprises an optical scanning means and a condenser lens and which is arranged to receive the coherent light from the light source 11 and to scan the same thereby to form, on a plane A1, a secondary light source (surface illuminant) having a predetermined configuration and a predetermined extent. A condensing optical system 17 receives the light from the secondary light source plane A1. Denoted by reference numeral 18 is a surface to be irradiated, which may be a pattern bearing surface of a reticle or a mask on which a circuit pattern is formed. Denoted by reference numeral 19 is a projection optical system operable to project the circuit pattern of a reticle or otherwise, placed on the surface 18 being irradiated, upon the surface of a wafer 21, thereby to transfer the circuit pattern onto the wafer surface.

The condensing optical system 17 of the present embodiment is arranged to illuminate the surface 18, to be irradiated, by use of a coherent light flux, having been concentrated upon the secondary light source plane A1 and thus having formed a light spot thereupon. Also, the condensing optical system 17 is adapted to form an image of the secondary surface light source plane A1, in the neighborhood of an entrance pupil 20 of the projection optical system 19. Thus, the condensing optical system 17 serves to provide a Kohler illumination system for the wafer 21.

FIG. 7B shows details of a portion of the illumination device of the present embodiment, including the scanning system 200. In this Figure, reference numeral 33 denotes the coherent light supplied by the light source 11. Reference numerals 71 and 72 denote, respectively, wedge-shaped optical members each having a light transmissibility and providing a prism. The optical members 71 and 72 are made rotatable either in the same direction or in opposite directions. Denoted by reference numeral 73 is a condensing lens.

In operation, the two wedge-shaped optical members 71 and 72 are rotated by a rotational driving means (not shown) about the optical axis O of the condensing lens 73 at different angular speeds W1 and W2.

In the illumination device of the present embodiment, the coherent light 33 from the light source 11 is concentrated by the condensing lens 73 upon the secondary light source plane A1. At this time, the light from the light source 11 is scanned by the scanning system 200 so that, at different moments in a particular time period, different light fluxes are concentrated upon different positions on the secondary light source plane A1. By this means, a secondary light source (image) of a generally circular shape is formed in the plane A1. Also, by suitably setting the wedge angle of each wedge-shaped optical member, a scan range having a desired extent and configuration is attained. By doing so, the surface to be irradiated can be illuminated with a desired coherency of illumination.

FIG. 8A is schematically shows an example of the shape of the secondary light source that can be formed on the plane A1 in a case when a ratio 3:7 is established between the number of revolutions of one of the two wedge-shaped optical members 71 and 72 and that of the other. In FIG. 8A, reference numeral 82 denotes the locus of the point of convergence of the light being scanned, namely the locus of the scan of the light spot.

In this embodiment, by suitably and variably setting the ratio of the number of revolutions, between the two wedge-shaped optical members 71 and 72, the concentrated light can be scanned on the plane A1 along various paths, i.e. loci of scan. Examples are illustrated in FIGS. 8B and 8C. The FIG. 8B example corresponds to a case when the ratio of the number of revolutions, between the optical members 71 and 72, is set to 3:8. The FIG. 8C example corresponds to a case when the ratio is set to 5:11.

It should be noted here that the light from the light source 11 may be divided into a plurality of light fluxes. Alternatively, a plurality of light sources may be used. In either case, by projecting a plurality of light fluxes upon the scanning system 200 (for example by projecting seven light fluxes upon the scanning system with different angles), it is possible to define on the plane A1 a plurality of loci of the scanned light fluxes (e.g. seven loci such as shown in FIG. 8D) without any overlapping. By doing so, a desired coherency of illumination can be very easily attained In the present embodiment, as described, two light-transmissible wedge-shaped optical members 71 and 72 are disposed close to each other and they are rotated to scan the light. As a result, the illumination device as a whole can be easily made compact as compared with a case when a rotatable mirror is used to scan the light.

In the present embodiment, three or more wedge-shaped optical members may be used. By rotating these optical members at different angular speeds, a secondary light source having a desired shape (the locus of scan) can be formed.

Further, the wedge-shaped optical members may be made of different materials in consideration of the effect of chromatic aberration or otherwise.

In the present embodiment, as described, the light from a secondary light source (surface illuminant) which is formed spatially is directed by a condensing lens to the surface such as a reticle surface, to be irradiated. However, the light from the secondary surface light source may be once received by a multi-beam producing system such as a fly's eye lens system, a bundle of optical fibers or otherwise and, by way of such a multi-beam producing system, the light may be directed to the surface to be irradiated. When such a multi-beam producing system is used, the surface to be irradiated can be illuminated very uniformly. Also, plural compound-eye optical systems such as fly's eye lens systems may be disposed in an array extending in the advancing direction of the light. This is effective to further enhance the uniformity of the illumination.

With these embodiments of the present invention, a second surface light source of a desired shape is easily attainable from coherent light and with a simple structure. Additionally, a desired coherency of illumination is attained with a simple and compact structure. Therefore, it is possible to provide an illumination device which is small in size and which is suitably usable in a semiconductor device manufacturing projection exposure apparatus.

Figure 9:
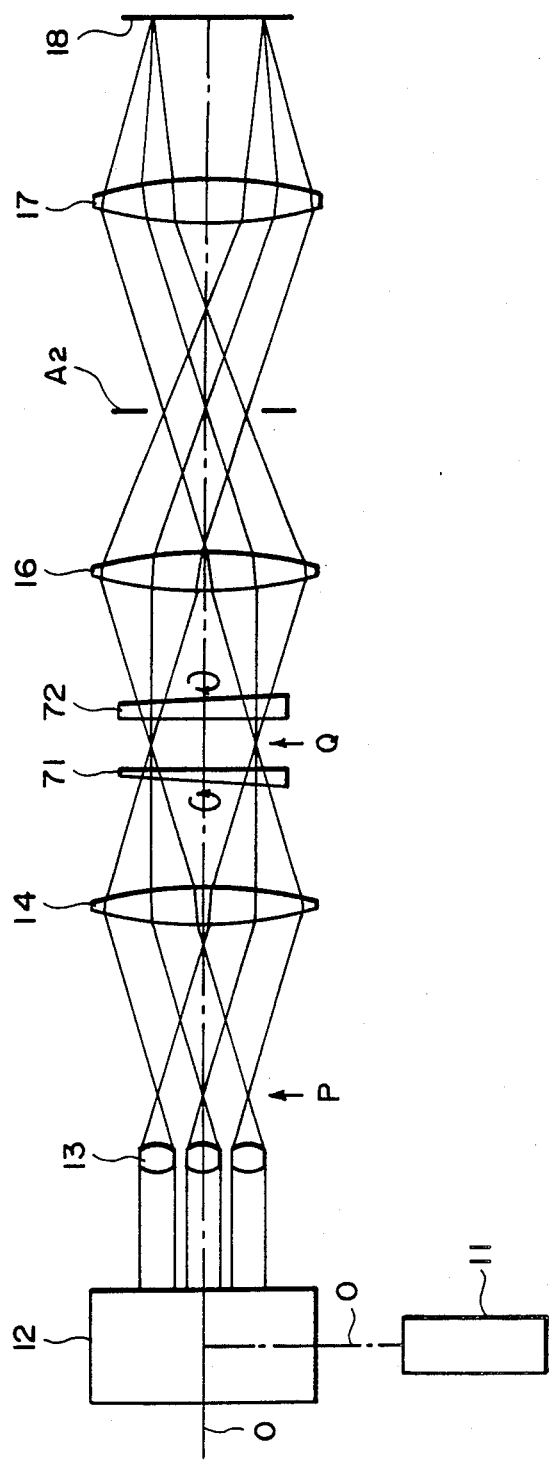
FIG. 9 is a schematic view of an illumination device according to a further embodiment of the present invention.

Referring now to FIG. 9, there is shown an illumination device according to a further embodiment of the present invention, which corresponds to an improved form of the illumination device of the FIG. 2 embodiment.

As shown in FIG. 9, the illumination device includes a light source 11 such as an excimer laser, which produces coherent light; a light dividing device 12; a fly's eye lens system 13 comprising a plurality of lens elements which are regularly disposed in a plane perpendicular to the optical axis O; a condenser lens 14 whose first or front focal point is coincident with a plane (as indicated by an arrow P) upon which the light from the fly's eye lens system 13 is converged; two wedge-shaped transparent optical members 71 and 72 which are similar to the wedge-shaped optical members shown in FIGS. 7A and 7B and which are rotatable about the optical axis O. The second or rear focal point of the condenser lens 14 is positioned at the midpoint (as indicated by an arrow Q) between the two optical members 71 and 72. The device further includes a condensing optical system 16 adapted to concentrate the light, deflected by the optical members 71 and 72, upon the plane including of a stop A2 which is disposed at a position optically conjugate with an entrance pupil of an imaging optical system (not shown in this Figure), as has been described with reference to FIG. 2. By concentrating the light fluxes from the optical members 71 and 72, a plurality of light spots are formed on the plane (aperture plane) of the stop A2. Denoted by reference numeral 17 is a second condensing optical system which is operable to direct the light, concentrated upon the stop A2 position, to a surface 18 to be irradiated (such as a pattern bearing surface of a reticle or a mask). Further, in this embodiment, the position of the stop A2 and the position of the surface 18 to be irradiated correspond, respectively, to the front focal point position and the rear focal point position of the second condensing optical system. By arranging the optical elements to satisfy such a relation, the light fluxes from the plural light spots distributed in the plane of the stop A2 (which intersects the optical axis perpendicularly) can be efficiently superimposed upon one another on the surface 18.

In the illustrated arrangement, the position which is indicated by the arrow P is optically conjugate with the position of the stop A2 and, additionally, with the entrance pupil of the imaging optical system (not shown in this Figure). Further, the position as indicated by the arrow Q is optically conjugate with the surface 18.

The wedge-shaped transparent optical members 71 and 72 are separately held by respective holding members (not shown). Each of the optical members 71 and 72 is rotated with its holding member by a rotational driving means (not shown), the direction and the speed of rotation being controlled thereby.

Of the components constituting the illumination device of the present embodiment, those having transmissibility to light (such as lenses or prisms) are all made of $SiO_2$. This is very effective for efficient utilization of the coherent light as supplied from the light source 11 which comprises an excimer laser in this embodiment and, therefore, the intensity of the illumination light can be increased significantly.

The parallel and coherent light emitted from the light source 11 is incident on the light dividing device 12 by which the coherent light is divided into plural light fluxes. Additionally, in the light dividing device 12, a predetermined optical path difference (a difference in the optical path length) is established between or among the divided light fluxes. As a result, plural light fluxes are emitted from the light dividing device 12 in a state in which they are mutually incoherent. Namely, the light dividing device 12 produces incoherent light fluxes. Details of the light dividing device 12 will be described later, in conjunction with some of the drawings.

The parallel and mutually incoherent light fluxes emitted from the light dividing device 12 are incident upon the fly's eye lens system 13. The number of the lens elements constituting the fly's eye lens system 13 and the number of the parallel light fluxes are in a one-to-one relation, such that each light flux enters into a corresponding one of the lens elements of the fly's eye lens system 13. Each light flux incident upon the corresponding lens element of the fly's eye lens system 13 is focused upon the second or rear focal point of the fly's eye lens system 13 by the action thereof. It should be noted here that, although in the present embodiment each light flux from the light dividing device 12 is focused upon the rear focal point of the fly's eye lens system 13 because of the fact that each light flux comprises a parallel light flux, the point of convergence is not limited to the focal point position denoted by an arrow P in FIG. 9. Each light flux may be focused at any other position. That is, if each light flux emitted from the light dividing device 12 is converging or diverging, it is not focused upon the focal point of the fly's eye lens system 13.

In this embodiment, the fly's eye lens system 13 comprises lens elements each having a positive refracting power. However, the fly's eye lens system may be provided by lens elements each comprising a concave lens or otherwise having a negative refracting power.

The rear focal point of the fly's eye lens system 13, namely the position of convergence of each light flux as indicated by arrow P in FIG. 9, is coincident with the front focal point of the condenser lens 14. For this reason, each light flux having been focused upon the focal point of the fly's eye lens system 13 enters into the condenser lens 14 in the form of a diverging light flux. Also, by this condenser lens 14, each divergent light flux incident thereupon is transformed into a parallel light flux. However, it should be noted that the plural light fluxes as obtainable by the condenser lens 14 are inclined with different angles with respect to the optical axis O, such that the parallel light fluxes are incident upon the optical member 71 at different angles.

The parallel light fluxes each having been refracted and deflected by the wedge-shaped optical members 71 and 72 are directed to the condensing optical system 16, whereby they are concentrated upon the plane including the rear focal point of the condensing optical system 16, namely the aperture plane of the stop A2. By this means, in the plane of the stop A2, which plane is perpendicular to the optical axis O, a distribution of plural light spots is formed. The position of each light spot on the stop A2 plane is determined by the angle of incidence of a corresponding parallel light flux (which has made the light spot) upon the condensing optical system 16.

In the manner described hereinbefore, plural incoherent light fluxes as supplied from the light dividing device 12 are used to form on the plane of the stop A2 a plurality of optical stops, defined by mutually incoherent light fluxes.

At this time, the wedge-shaped optical members 71 and 72 are rotated by the unshown rotational driving means with different rotational speeds, thereby to deflect at the same time the parallel light fluxes incident upon the optical members 71 and 72 and thereby to scan the same. As the parallel light fluxes are scanningly deflected in this manner, the light spots formed on the plane of the stop A2 are scanningly moved, at the same time, two-dimensionally along the stop A2 plane.

The manner of scan of the light spots may be such as shown in FIG. 3 and having been described with reference to this Figure. Namely, the light fluxes forming the light spots at different times are mutually incoherent. Also, as described hereinbefore, the light fluxes forming the light spots at the same time are mutually incoherent. Therefore, all the light fluxes forming the light spots on the stop A2 surface in a predetermined time period are mutually incoherent.

In this manner, within a predetermined very short time period (for example, a time period for the exposure of one shot area on the wafer or a time period during which a predetermined number of light pulses are supplied from the excimer laser), a large number of light spots can be formed on the aperture plane of the stop A2 by mutually incoherent light fluxes. Additionally, these light spots can be scanned at a high speed. Therefore, an incoherent light source having a substantial extent is easily provided. This assures formation of an illumination system having desired coherency of illumination, which enables further enhancement of the imaging performance of the imaging optical system used with the illumination device.

It will be readily understood also from FIG. 3 that, in the illumination device of the present embodiment, only the scan of the light spots within a narrow and limited range of the aperture plane of the stop A2 is sufficient for the required incoherence transformation. Accordingly, even when an incoherent light source having a large extent is desired, the scan can be accomplished within a very short time. Further, the scan of the light spots is attainable simply by rotating simple transparent members such as the wedge-shaped optical members or prisms, as shown in FIG. 9. This allows simplified drive and control for the scan, as compared with a case when an oscillating mirror or the like is used.

Referring back to FIG. 9, the incoherent lights from the light spots formed on the aperture plane of the stop A2 are projected upon the second condensing optical system 17 in the form of diverging light. The second condensing optical system 17 serves to converge the diverging incoherent light fluxes so that they are transformed into parallel light fluxes and are superimposed upon one another on the surface 18, to be irradiated. In this manner, the surface 18 is illuminated.

The stop A2 corresponds to an entrance pupil of the optical system shown in FIG. 9 and, for this reason, the surface 18 is illuminated in the Kohler illumination fashion, in this embodiment. This is effective to avoid any unevenness in the illuminance distribution on the surface 18 which might be caused by the luminance distribution of the light spots formed on the plane of the stop A2. Further, as has been described in the foregoing, when the illumination device of the present embodiment is used as one component of a projection exposure system for illuminating a reticle, the stop A2 may be set so as to be optically conjugate with the entrance pupil of an imaging optical system used in the projection exposure system for the projection exposure purpose. Therefore, also with regard to a wafer, various advantageous effects such as attainable with regard to the surface 18 (which may be a reticle surface or a mask surface) are obtainable.

Referring now to FIGS. 10A, 10B, 11A and 11B, further details of the light dividing device 12 of the FIG. 9 embodiment will be described. Of these Figures, FIGS. 10A and 10B schematically show the structure of the light dividing device 12, wherein FIG. 10B is an illustration of the device as viewed in the direction indicated by an arrow A in FIG. 10A. FIGS. 11A and 11B are views for illustrating the distribution of divided and incoherence-transformed light fluxes, obtainable by the action of the light dividing device 12.

In FIGS. 10A and 10B, the light dividing device includes dividing mirrors 101-112 which are distributed along the advancing direction of the coherent light flux from the light source 11, for dividing the same into plural light fluxes. The mirrors denoted by numerals 101-106 cooperate with each other to form a dividing unit Y, whereas the mirrors denoted by numerals 107-112 cooperate with each other to form another dividing unit X. These two dividing units X and Y are operable to bend or deflect the optical path of the light flux along orthogonal planes and also to divide the light flux in orthogonal planes.

More specifically, the dividing unit Y is provided by a pair of mirrors 101 and 104, a pair of mirrors 102 and 105, and a pair of mirrors 103 and 106. Thus, a single light flux is divided by the dividing unit Y into three light fluxes. Also, these light fluxes travel along respective optical paths having predetermined optical path differences therebetween, as determined by the three pairs of mirrors of the dividing unit Y. Similarly, the dividing unit X is provided by a pair of mirrors 107 and 110, a pair of mirrors 108 and 111, and a pair of mirrors 109 and 112. These three pairs of mirrors function essentially in the same manner as the mirrors of the dividing unit Y.

In FIGS. 11A and 11B, numeral 240 denotes the coherent light flux which enters the light dividing device 12. Numeral 250 indicates three incoherent parallel light fluxes emitted from the dividing unit Y to the dividing unit X. Numeral 260 indicates nine incoherent parallel light fluxes emitted from the dividing unit X and emerging out of the light dividing device 12. Further, characters h, k and l are assigned to specify each of the three individual coherent light fluxes generally denoted by reference numeral 250. Also, characters h1–h3, k1–k3 and l1–l3 are assigned to specify each of the nine individual light fluxes generally denoted by reference numeral 260.

The function of the light dividing device 12 will now be described in more detail, particularly in conjunction with FIGS. 10A, 10B, 11A and 11B.

On the basis of the coherence length of the coherent light as supplied from the light source 11 (FIG. 9), the optical path difference $\Delta j$ to be provided between the divided light fluxes is determined. Namely, such a difference $\Delta j$ that satisfies the relation "$\Delta j >$ coherence length" is set and the locations of the mirrors 101–112 are determined in consideration of the thus determined difference $\Delta j$.

The coherent parallel light flux from the light source 11 enters the dividing unit Y of the light dividing device 12 and, in this unit, the path of the light flux is divided into three by the three pairs of mirrors 101 and 104; 102 and 105; and 103 and 106, whereby the single coherent light is divided into three light fluxes h, k and l. At this time, there is the same optical path difference $L_1$ ($L_1 \geq \Delta j$) between the optical paths for the fluxes h and k and between the optical paths for the fluxes k and l. Accordingly, the three light fluxes h, k and l travel along optical paths having different lengths (each difference is $L_1$). The light fluxes h–l emitted from the dividing unit Y enters the other dividing unit X in which each of the optical paths for the light fluxes h–l is divided into three by the three pairs of mirrors 107 and 110; 108 and 111; and 109 and 112 of the dividing unit X. By this, each of the light fluxes h–l is divided into three and whereby nine light fluxes h1–h3, k1–k3 and l1–l3 are obtained. Similarly, the dividing unit X is arranged so that, for each of the three sets of light fluxes h1–h3; k1–k3; and l1–l3, a predetermined optical path difference $L_2$ ($L_2 > \Delta j$) is assigned between adjacent light fluxes. As a result, the nine light fluxes h1–l3 are incoherent light fluxes.

In this embodiment, the mirrors 101–112 are arranged so as to satisfy the relations $L_2 \geq \Delta j$ and $L_1 > 3L_2$. With this arrangement, the dividing unit X and thus the light dividing device 12 can emit fluxes h1–l3 (generally denoted at 260) of satisfactorily incoherent light fluxes.

Further, in the light dividing device of the present embodiment, the divided and incoherence-transformed light fluxes h1–l3 are emitted from the light dividing device without spatial overlapping, namely with an interval D, as is best seen in FIG. 11B. This is adopted to ensure that, when the light fluxes from the light dividing device 12 are incident upon the fly's eye lens system 13 disposed downstream of the light dividing device 12, two or more light fluxes do not overlappingly enter an individual lens element of the fly's eye lens system 13. The dimension of the interval D can be easily and suitably determined by adjusting the locations of the mirrors 101–112. Also, when the lens elements of the fly's eye lens system are close to each other so that they form an integral optical member, the mirrors 101–112 may be disposed so as to satisfy "D=0".

While a single coherent light flux is divided into nine in the present embodiment, the number of division can be easily and suitably changed by changing the number and disposition of the mirrors. A higher number of division is preferable, because the incoherent light spots formed on the plane of the stop A2 can be distributed more closely so that further reduction of the scan time is attainable. However, complication of the structure of the light dividing device may arise because of the larger number of mirrors required. Therefore, the division of the light to be made by the light dividing device should be preferably set in consideration of the above-described structural or functional problems or other factors.

In the present embodiment, the coherent light flux is divided into nine incoherent light fluxes h1–l3 each with an optical path difference not less than $\Delta j$. If the spatial coherency of the light from the light flux 11 is not good and, for example, the light fluxes h and k shown in FIGS. 11A and 11B can be considered as originally incoherent, it is not necessary to assign an optical path difference for the light fluxes h and k for the incoherence transformation purpose, although a specific optical path difference should be assigned between the light fluxes h and l and between the light fluxes k and l.

Figure 12:
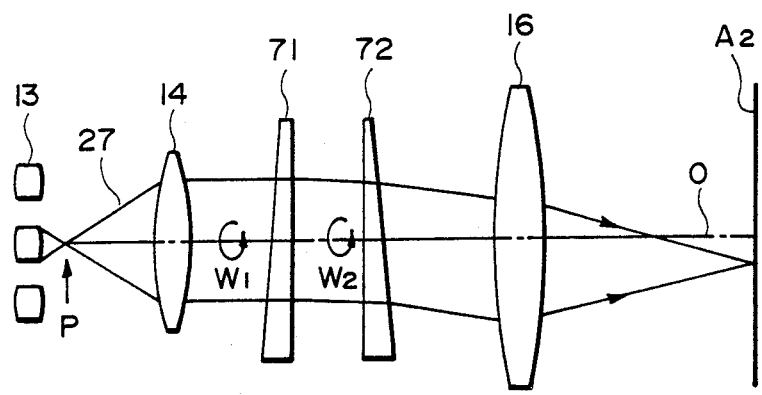
FIG. 12 is an enlarged and schematic view showing details of a scanning optical system included in the illumination device of the FIG. 9 embodiment.

FIG. 12 is an enlarged view of the scanning optical system included in the illumination device of the FIG. 9 embodiment and comprising a pair of wedge-shaped optical members 71 and 72.

A light flux having been concentrated at a position, indicated by an arrow P, by one lens element of the fly's eye lens system 13 forms thereat a light spot. The diverging light 27 from the light spot is transformed into a parallel light flux by the condenser lens 14 and directed to the wedge-shaped optical members 71 and 72. These optical members 71 and 72 rotate about the optical axis O at different rotational speed to thereby scanningly deflect the incident parallel light flux in a predetermined range and along a predetermined locus of scan. As a result, the light spot upon the aperture plane of the stop A2, which is formed by the condensing optical system 16 that receives the scanningly deflected parallel light flux from the optical members 71 and 72, is scanned in the aperture plane along a predetermined locus.

Similarly, the remaining lens elements of the fly's eye lens system 13 serve to form a large and corresponding number of light spots. Accordingly, the lights from these light spots produce, with the aid of the condenser lens 14, the wedge-shaped optical members 71 and 72 and the condensing optical system 16, corresponding light spots on the aperture plane of the stop A2. Thus, on the aperture plane of the stop A2, a large number of light spots are formed and are scanned with the rotation of the wedge-shaped optical members 71 and 72.

Figure 13:
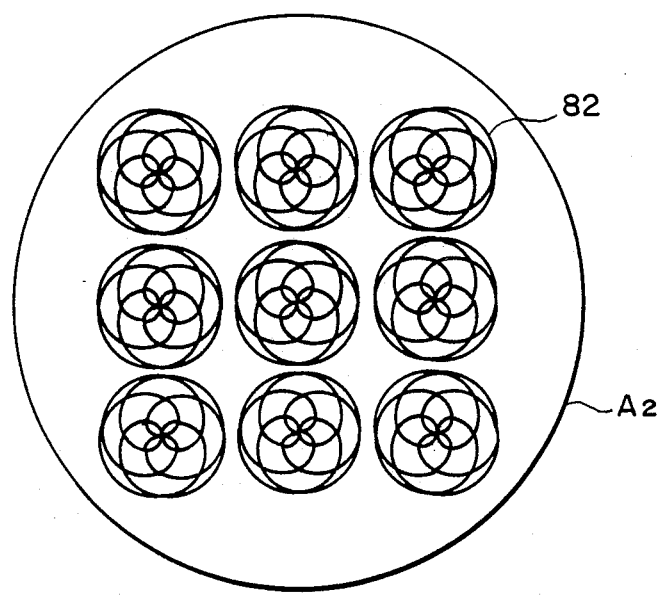
FIG. 13 is a schematic view showing the locus of scan as can be determined by the scanning optical system of the FIG. 12 example.

FIG. 13 shows an example of loci of a scan as defined on the aperture plane of the stop A2 by the scan of a large number of light spots. In the FIG. 13 example, the wedge-shaped optical members 71 and 72 are rotated at a set rotational speed ratio of 3:7. The locus of scan of the light spot on the aperture plane, namely the manner of scanning movement of the light spot, can be easily controlled by variably setting the rotational speed ratio of the wedge-shaped optical members 71 and 72. Examples are illustrated in FIGS. 8A–8D.

Further, by suitably selecting the wedge angle and the refractive index of the wedge-shaped optical members 71 and 72, a desired extent of the scan range for each light spot is easily attainable. Also, the locus of scan can be changed easily.

Accordingly, a desired coherency of illumination can be accomplished by providing a suitable distribution of light spots on the aperture plane of the stop A2 and in a predetermined time period, by using the above-described principle of control. As a result, when the illumination device of the present embodiment is incorporated into a projection exposure system, the imaging performance of an imaging optical system included in the exposure system can be improved significantly.

The light spots distributed on the aperture plane of the stop A2 are provided by mutually incoherent lights, as described hereinbefore. Further, the scan of these light spots ensures incoherence-transformation of the light with respect to time. Therefore, the adverse effect of the interference pattern, which might be caused on the surface, to be irradiated, by the lights from the light spots, can be minimized satisfactorily. Accordingly, the surface to be irradiated can be illuminated with a uniform illuminance distribution.

While the invention has been described with reference to the structures disclosed herein, it is not confined to the details set forth and this application is intended to cover such modifications or changes as may come within the purposes of the improvements or the scope of the following claims.

What is claimed is:

1. An illumination device comprising:
   means for supplying coherent light;
   optical-path-difference applying means for dividing the coherent light into plural light fluxes and for applying an optical path difference or optical path differences to the light fluxes to provide plural light fluxes each of which is coherent in itself but which are mutually incoherent;
   an optical arrangement for receiving the light fluxes and for forming a plurality of light spots distributed in a plane substantially perpendicular to an optical axis of said optical arrangement, whereby a surface to be irradiated can be illuminated with light from said light spots, wherein said optical arrangement comprises scanning means for scanning said plane with said light spots and superposing means for superposing light fluxes from said light spots one upon another on the surface to be irradiated; and
   driving means for controllably driving said scanning means.

2. A device according to claim 1, wherein said supplying means comprises an excimer laser and wherein components of said illumination device having transmissibility to light are made of $SiO_2$.

3. A device according to claim 1, further comprising means, disposed between said applying means and said scanning means, for concentrating the light fluxes from said applying means upon a first plane, which is perpendicular to an optical axis of said optical system, so as to produce a distribution of light spots on said first plane.

4. A device according to claim 3, wherein said concentrating means comprises a fly's eye lens system.

5. A device according to claim 3, further comprising a condenser lens system effective to transform light fluxes from said light spots into parallel light fluxes and also to direct each parallel light flux to said scanning means.

6. A device according to claim 5, further comprising a condensing optical system, disposed between said scanning means and said optical system, for concentrating the parallel light fluxes, having been scanned by said scanning means, upon a second plane perpendicular to the optical axis of said optical system to thereby produce a distribution of light spots on said second plane.

7. A device according to claim 6, wherein said condensing optical system comprises an $f-\theta$ lens.

8. A device according to claim 6, wherein said first and second planes are optically conjugate with each other.

9. A device according to claim 8, wherein said illumination device is used in a projection exposure system for illuminating a reticle used with the projection exposure system and wherein said second plane is located at a position which is optically conjugate with an entrance pupil of an imaging optical system included in the projection exposure system.

10. A device according to claim 1, wherein said optical system includes point source forming means arranged to converge the light fluxes to form a plurality of point light sources in a plane perpendicular to an optical axis of said optical system, and superimposing means for superimposing light fluxes from said point light sources upon one another on the surface to be irradiated.

11. A device according to claim 1, wherein said scanning means includes a mirror which is rotationally movable about a predetermined axis.

12. A device according to claim 1, wherein said scanning means includes a pair of wedge-shaped optical members each being rotationally movable about the optical axis of said optical system and wherein the light fluxes incident upon said scanning means pass through said wedge-shaped optical members and are directed to said optical system.

13. An illumination device usable in a projection exposure system having an imaging optical system for forming an image of a circuit pattern of a reticle on a wafer, for illuminating the reticle, said device comprising:
   a light source for supplying coherent light;
   optical-path-difference applying means for dividing the coherent light into plural light fluxes and for applying an optical path difference or optical path differences to the light fluxes to provide plural light fluxes each of which is coherent in itself but which are mutually incoherent;
   an optical system for converging the light fluxes from said optical-path-difference applying means to form a plurality of point light sources at an entrance pupil of the imaging optical system, and for illuminating the reticle by use of the light fluxes; and scanning means disposed to receive the light fluxes from said optical-path-difference applying means, for scanningly deflecting the light fluxes to scan said point light sources at the entrance pupil of the imaging optical system.

14. An illumination method, comprising the steps of: providing a coherent beam;

dividing the coherent beam into plural beams and applying a mutual optical path difference or optical path differences to the plural beams to provide plural mutually incoherent beams;

forming plural mutually incoherent beam spots distributed in a plane by using the mutually incoherent beams;

scanning the plane with the beam spots; and superposing beams from the beam spots one upon another on a surface to be illuminated.

15. An illumination method comprising the steps of:

dividing a coherent beam into plural beams and applying an optical path difference or optical path differences to the plural beams to provide plural mutually incoherent beams;

projecting the mutually incoherent beams toward a surface to be illuminated in different respective directions, wherein the mutually incoherent beams are deflected to scan a pupil plane of a projection lens;

wherein the step of projecting the mutually incoherent beams further comprises receiving the mutually incoherent beams by the projection lens; respectively forming a plurality of beam spots through the mutually incoherent beams on the pupil plane; scanning the pupil plane with the beam spots; and superposing beams from the beam spots one upon another on the surface to be illuminated.

16. A method according to claim 15, wherein the step of dividing the coherent beam into plural beams comprises providing an excimer laser beam and dividing the excimer laser beam into plural beams; and the step of applying an optical path difference or optical path differences to the plural beams to provide mutually incoherent beams comprises directing the plural beams along different paths.

17. An illumination method using a laser, comprising the steps of:

dividing a laser beam from the laser into plural beams and applying an optical path difference or optical path differences to the beams to provide plural mutually incoherent laser beams; and scanning a predetermined plane with the incoherent laser beams and directing the incoherent laser beams along different directions from the predetermined plane to a surface to be illuminated, so that they are superposed one upon another on the surface to be illuminated.

18. An exposure apparatus, comprising: p1 a laser;

means for dividing a laser beam from said laser into plural beams and for applying an optical path difference or optical path differences to the beams to provide plural mutually incoherent laser beams; and an optical system having a pupil plane, for directing the incoherent laser beams in different directions to a mask so that a wafer is exposed to a pattern of the mask, said optical system comprising scanning means for scanning the pupil plane with the incoherent laser beams.

19. An apparatus according to claim 18, wherein said optical system further comprises an optical integrator for receiving the incoherent laser beams and for forming plural mutually incoherent beams spots distributed on the pupil plane, and wherein the mask is illuminated with laser beams from the beam spots distributed on the plane.

20. An apparatus according to claim 19, wherein said laser comprises an excimer laser.

21. An apparatus according to claim 19, wherein said scanning means comprises a rotatable reflection mirror for deflecting the incoherent laser beams by reflection.

22. An apparatus according to claim 19, wherein said scanning means comprises a wedge-shaped transparent member rotatable about an optical axis of said optical system for deflecting the laser beams by refraction.

23. An apparatus according to claim 18, further comprising a projection optical arrangement provided between the mask and the wafer for projecting an image of the pattern of the mask onto the wafer.

24. An apparatus according to claim 18, wherein said optical system is arranged to form plural beam spots with the incoherent laser beams being distributed on the pupil plane and to illuminate the mask with the laser beams from the beam spots.

25. An apparatus according to claim 24, further comprising a projection optical arrangement for projecting an image of the pattern of the mask onto the wafer and wherein the pupil plane is defined at a position which is substantially optically conjugate with a pupil of said projection optical arrangement.

* * * * *

UNITED STATES PATENT AND TRADEMARK OFFICE
CERTIFICATE OF CORRECTION

PATENT NO. : 4,974,919                    Page 1 of 2
DATED     : December 4, 1990
INVENTOR(S) : Masato Muraki, et al.

It is certified that error appears in the above-identified patent and that said Letters Patent is hereby corrected as shown below:

ON THE COVER PAGE

IN THE TITLE

"ILLUMINATING DEVICE" should read --ILLUMINATION DEVICE--.

IN THE U.S. PATENT DOCUMENTS

"Dubroeuco et al." should read --Dubroeucq et al.-- (both occurrences).

COLUMN 1

Line 1, "ILLUMINATING DEVICE" should read --ILLUMINATION DEVICE--;
Line 50, "4,373,744" should read --4,373,774--.

COLUMN 3

Line 5, "4,373,744" should read --4,373,774--.

COLUMN 9

Line 61, "light flux in" should read --light flux $i_n$--.

UNITED STATES PATENT AND TRADEMARK OFFICE
CERTIFICATE OF CORRECTION

PATENT NO. : 4,974,919

DATED : December 4, 1990

INVENTOR(S) : Masato Muraki, et al.

It is certified that error appears in the above-identified patent and that said Letters Patent is hereby corrected as shown below:

COLUMN 16

Line 21, "respective!y," should read --respectively,--; and
Line 46, "is" should be deleted.

COLUMN 17

Line 6, "attained" should read --attained.--.

COLUMN 22

Line 20, "division" should read --divisions--.

COLUMN 26

Line 9, "comprising: P1 a laser" should read --comprising:
¶ a laser;--.

Signed and Sealed this

Seventh Day of July, 1992

Attest:

DOUGLAS B. COMER

Attesting Officer

Acting Commissioner of Patents and Trademarks